United States Patent
Park (10) Patent No.: US 9,465,495 B2
(45) Date of Patent: Oct. 11, 2016

(54) DISPLAY DEVICE HAVING A REDUCED BEZEL WIDTH

(71) Applicant: Samsung Display Co., Ltd., Yongin, Gyeonggi-Do (KR)

(72) Inventor: Hyun Sik Park, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 83 days.

(21) Appl. No.: 14/302,288

(22) Filed: Jun. 11, 2014

(65) Prior Publication Data

US 2015/0185903 A1 Jul. 2, 2015

(30) Foreign Application Priority Data

Dec. 31, 2013 (KR) .......................... 10-2013-0169360

(51) Int. Cl.
  *G06F 3/041* (2006.01)
  *G06F 3/044* (2006.01)
  *H01L 27/32* (2006.01)

(52) U.S. Cl.
  CPC .............. *G06F 3/044* (2013.01); *G06F 3/0412* (2013.01); *G06F 2203/04111* (2013.01); *H01L 27/323* (2013.01)

(58) Field of Classification Search
  CPC .......... G06F 3/033; G06F 3/02; G06F 3/041; G06F 3/045; G09G 5/08; G09G 5/00; G06K 11/06; G08C 21/00
  USPC ..................... 345/156–175; 178/18.01–18.06
  See application file for complete search history.

(56) References Cited

U.S. PATENT DOCUMENTS

| | | | |
|---|---|---|---|
| 7,468,775 B2 | 12/2008 | Lee et al. | |
| 7,948,586 B2 | 5/2011 | Yamada et al. | |
| 8,049,412 B2 | 11/2011 | Kwak | |
| 8,890,830 B2 * | 11/2014 | Choi | G06F 3/041 345/156 |
| 2003/0235068 A1 * | 12/2003 | Deak | G11C 11/16 365/158 |
| 2010/0110041 A1 * | 5/2010 | Jang | G06F 3/0412 345/174 |
| 2011/0057892 A1 * | 3/2011 | Kwak | G06F 3/0412 345/173 |
| 2011/0061949 A1 * | 3/2011 | Krah | G06F 3/0418 178/18.06 |
| 2011/0063561 A1 * | 3/2011 | Song | G02F 1/1339 349/153 |
| 2011/0074705 A1 | 3/2011 | Yousefpor et al. | |
| 2012/0127095 A1 * | 5/2012 | Jun | G06F 3/044 345/173 |
| 2012/0262382 A1 * | 10/2012 | Guard | G06F 3/044 345/173 |

FOREIGN PATENT DOCUMENTS

| | | |
|---|---|---|
| JP | 4886488 B2 | 12/2011 |
| KR | 10-2011-0065957 A | 6/2011 |
| KR | 10-2012-0018589 A | 3/2012 |
| KR | 10-2012-0019543 A | 3/2012 |
| KR | 10-2012-0029008 A | 3/2012 |

* cited by examiner

*Primary Examiner* — Pegeman Karimi
(74) *Attorney, Agent, or Firm* — Knobbe Martens Olson & Bear LLP (57) ABSTRACT

A display device is disclosed. In one aspect, the display device comprises first and second substrates including a display area and a non-display area, a sealant material interposed between the first and second substrates and formed in the non-display area, and a plurality of touch electrodes formed in the display area of the second substrate. The display device further comprises a plurality of touch signal lines formed in the non-display area of the second substrate and respectively electrically connected to the touch electrodes, wherein the touch signal lines are configured to transmit/receive touch signals to/from the touch electrodes. The touch signal lines include one or more first signal lines not overlapping the sealant and one or more second signal lines at least partially overlapping the sealant.

18 Claims, 11 Drawing Sheets

DISPLAY DEVICE HAVING A REDUCED BEZEL WIDTH

CROSS-REFERENCE TO RELATED APPLICATIONS

This application claims priority to and the benefit of Korean Patent Application No. 10-2013-0169360 filed on Dec. 31, 2013, the entire contents of which are incorporated herein by reference.

BACKGROUND

1. Field

The described technology generally relates to a display device.

2. Description of the Related Technology

Flat panel displays (FPDs) such as an organic light-emitting diode (OLED) display, a liquid crystal display (LCD), and an electrophoretic display (EPD) include a display panel including a field generating electrode and an electro-optical active layer. The electro-optical active layer of the OLED display, the LCD, and the EPD include an organic emission layer, a liquid crystal layer, and charged particles, respectively. The field generating electrode is connected to a switching element such as a thin film transistor (TFT) so as to receive a data signal, and the electro-optical active layer converts the data signal to an optical signal to display an image.

Recently, display devices have been manufactured with touch sensing technology in which interaction with a user can be made through the display panel. Touch sensing functionality is used to detect touch information such as whether an object approaches or touches a screen and the location of a touch. Touch sensing functionality includes sensing changes in pressure, charges, light, and the like, which are applied to the touchscreen when the user writes text or draws figures by touching the screen using a finger or a touch pen. The display device can receive an image signal based on such touch information.

As the size of the display panel increases, the number of touch sensor channels and the number of touch signal lines for transmitting/receiving a signal to/from a touch electrode also increase. Typically, the touch signal line is designed to be provided in a peripheral area, which is a non-display area of the display panel. Recently, the demand for reducing the bezel width has increased.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One inventive aspect is to design a touch signal line for reducing a width of a peripheral area in a display device including a touch sensor.

Another aspect is a display device, comprising a lower substrate and an upper substrate, a sealant material interposed between the lower substrate and the upper substrate, and a display layer formed on the lower substrate, wherein the display layer includes an electro-optical active layer. The display device further comprises a touch electrode layer formed on the upper substrate, wherein the touch electrode layer includes a plurality of touch electrodes. The display device further comprises a display panel including a plurality of touch signal lines configured to transmit/receive touch signals to/from the touch electrodes, wherein the display panel includes a display area and a non-display area in a peripheral area of the display device, wherein the sealant is formed in the peripheral area, and wherein, in the peripheral area, the touch signal lines include one or more first signal lines not overlapping the sealant and one or more second signal lines at least partially overlapping the sealant.

In the above display device, the touch signal lines may be formed on the same layer as the touch electrodes. In the above display device, the second signal lines each may have a width less than about 5 μm. In the above display device, a gap may be formed between neighboring ones of the second signal lines, wherein the width of the gap may be greater than about 100 μm. In the above display device, each of the second signal lines may be formed of a metal. In the above display device, the touch signal lines may further include one or more auxiliary lines contacting the second signal lines. In the above display device, each of the auxiliary lines may be formed of a transparent conductive material. In the above display device, the auxiliary lines and the second signal lines may have substantially the same length.

In the above display device, each of the first signal lines may be formed of a metal. In the above display device, the first signal lines each may have a width of about 4.5 μm to about 195 μm. In the above display device, a gap may be formed between neighboring ones of the first signal lines, wherein the width of the gap may be about 4 μm to about 5 μm.

The above display device may further include a reflection layer formed between the sealant and the lower substrate.

In the above display device, the touch electrodes may include at least one pair of a first touch electrode and a second touch electrode, and one of the first touch and second touch electrodes may be a sensing input electrode and the other touch electrode may be a sensing output electrode. In the above display device, the touch signal lines may further include a plurality of first touch signal lines respectively electrically connected to the first touch electrodes and a plurality of second touch signal lines respectively electrically connected to the second touch electrodes.

In the above display device, the electro-optical active layer may be an organic emission layer and wherein the upper substrate may be an encapsulation substrate.

Another aspect is a display device, comprising first and second substrates including a display area and a non-display area, a sealant material interposed between the first and second substrates and formed in the non-display area, a plurality of touch electrodes formed in the display area of the second substrate, and a plurality of touch signal lines formed in the non-display area of the second substrate and respectively electrically connected to the touch electrodes, wherein the touch signal lines are configured to transmit/receive touch signals to/from the touch electrodes, and wherein the touch signal lines include one or more first signal lines not overlapping the sealant and one or more second signal lines at least partially overlapping the sealant.

In the above display device, the second signal lines may be thinner than the first signal lines. In the above display device, the second signal lines each may have a width less than about 5 μm.

Another aspect is a display device, comprising first and second substrates including a display area and a non-display area, a sealant material interposed between the first and second substrates and formed in the non-display area, a plurality of touch electrodes formed in the display area of the second substrate, and a plurality of touch signal lines formed in the non-display area of the second substrate and respectively electrically connected to the touch electrodes, wherein the touch signal lines are configured to transmit/receive touch signals to/from the touch electrodes, and wherein at least one of the touch signal lines overlaps the sealant.

In the above display device, at least another one of the touch signal lines may not overlap the sealant.

According to various embodiments, the touch signal line can be formed at a position where it overlaps the sealant that seals the upper substrate and the lower substrate in the peripheral area of the display panel. Therefore, the width of the peripheral area can be reduced and the width of the bezel can be reduced.

DETAILED DESCRIPTION OF CERTAIN INVENTIVE EMBODIMENTS

In the following detailed description, only certain exemplary embodiments of the described technology have been shown and described, simply by way of illustration. As those skilled in the art would realize, the described embodiments can be modified in various different ways, all without departing from the spirit or scope of the described technology.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements can also be present. In contrast, when an element is referred to as being "directly on" another element, there are no intervening elements present. In this disclosure, the term "substantially" means completely, almost completely or to any significant degree. Moreover, "formed on" can also mean "formed over".

A display device including a touch sensor according to an exemplary embodiment will now be described with reference to accompanying drawings.

Figure 1:
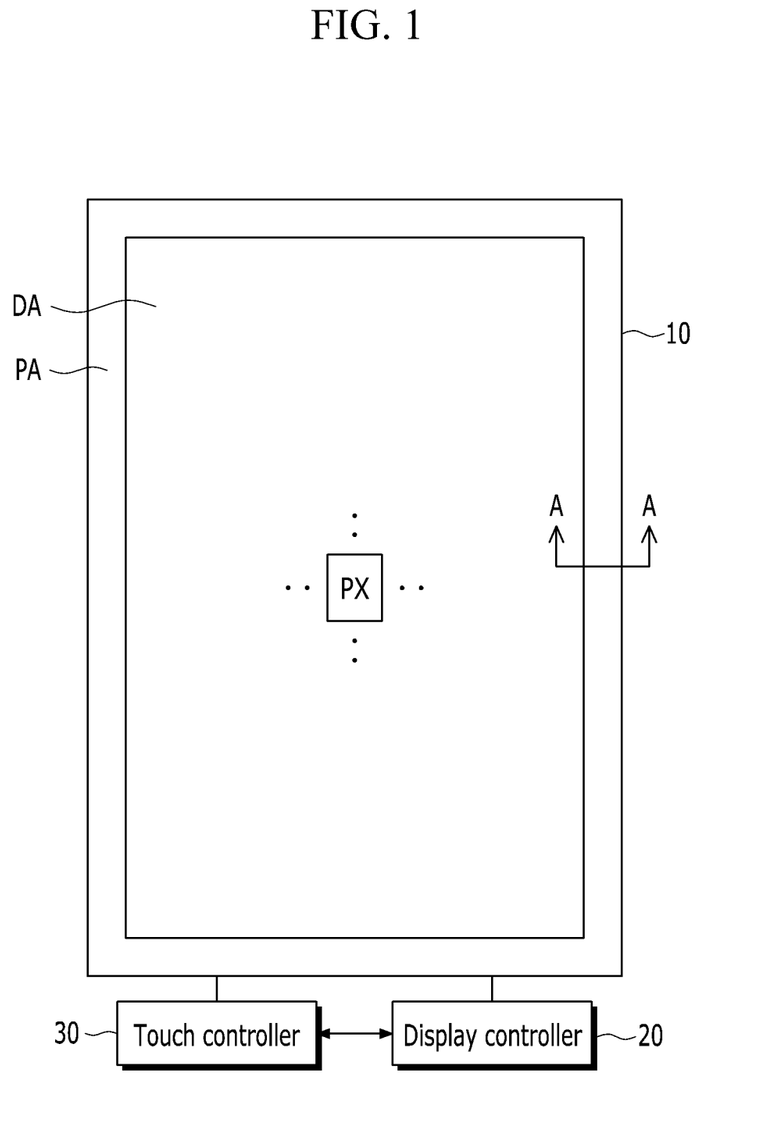
FIG. 1 shows a layout view of a display device including a touch sensor according to an exemplary embodiment.

Referring to FIG. 1, the display device includes a display panel 10, and a display controller 20 and a touch controller 30 electrically connected to the display panel 10.

The display panel 10 can display an image and sense a touch. The display panel 10 includes a display area (DA) for displaying the image and a peripheral area (PA).

A part or an entire region of the display panel 10 can be a touch active area (TA) for sensing the touch. The touch active area (TA) is a region that can be sensed through touching when an object (e.g., finger, pen, stylus, etc.) approaches or contacts the display panel 10. Here, the contacting includes when an external object such as a user's hand directly contacts the display panel 10 and when the external object hovers while approaching or having approached the display panel 10.

Figure 3:
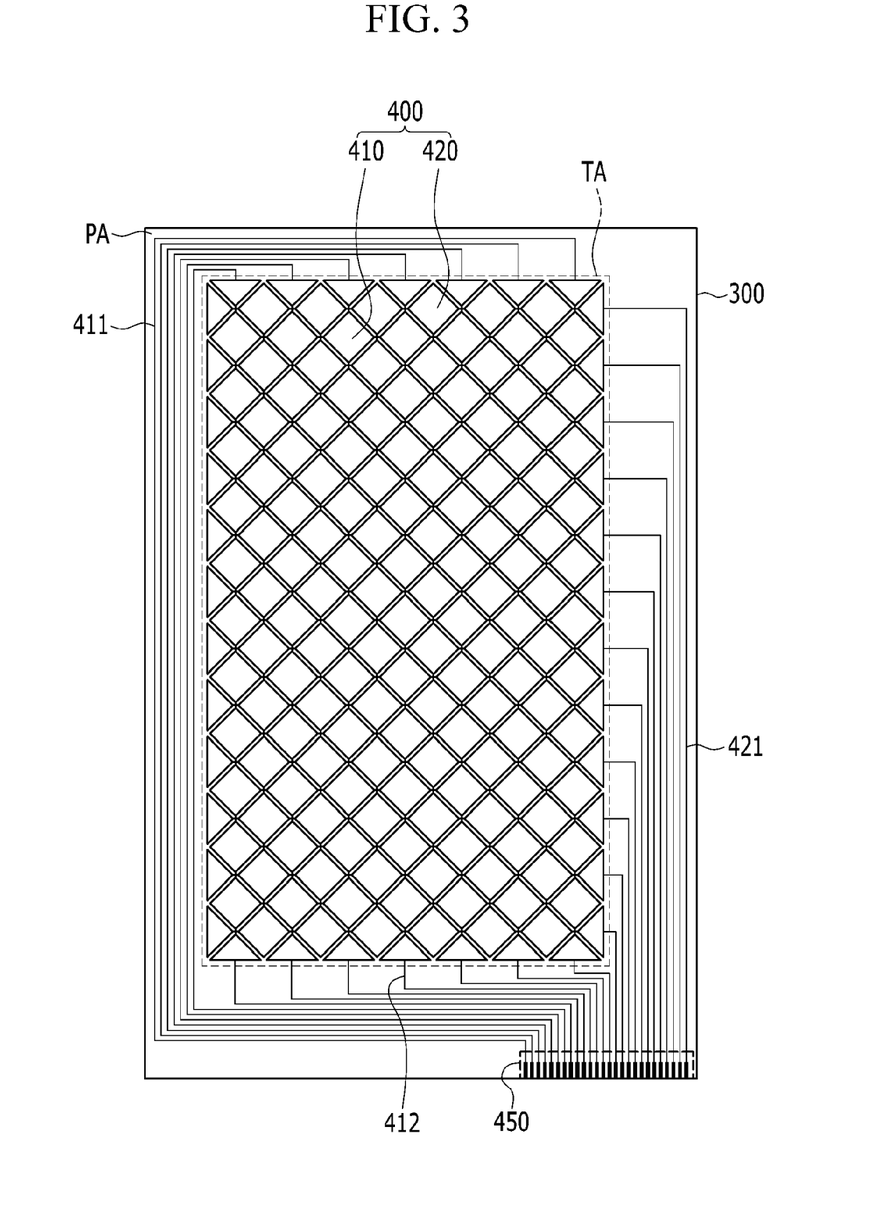
FIG. 3 shows a top plan view of a touch sensor of a display device according to an exemplary embodiment.

The display area (DA) can substantially correspond to the touch active area (TA) as shown in FIG. 3, but is not limited thereto. For example, the touch active area (TA) can correspond to a part of the peripheral area (PA) and/or a part of the display area (DA).

Figure 2:
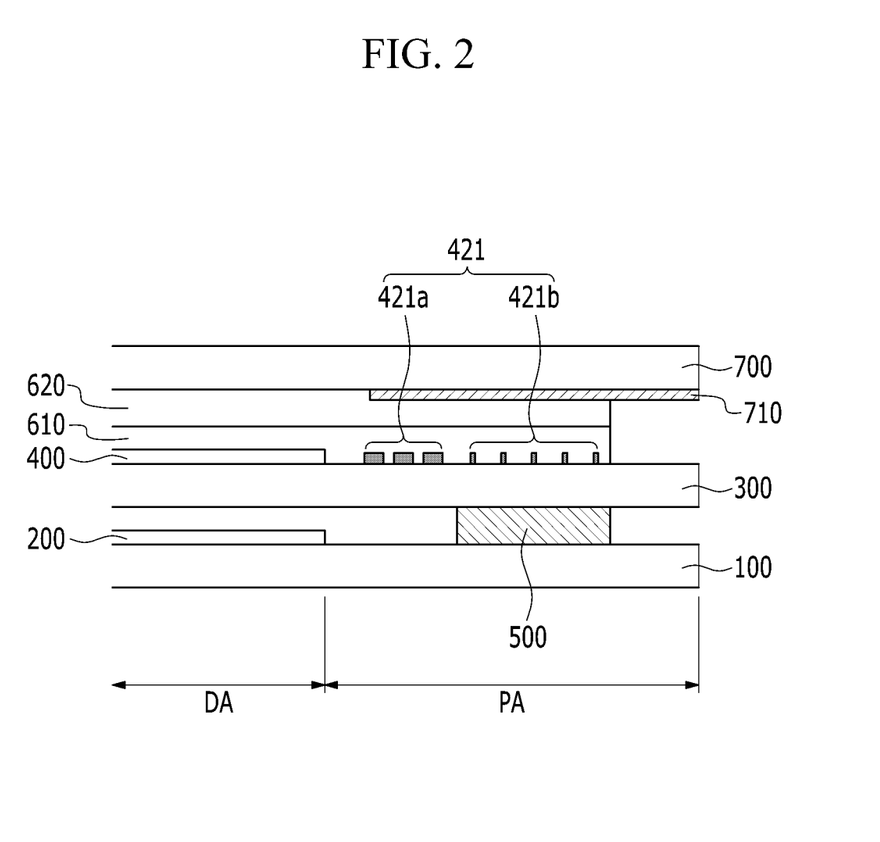
FIG. 2 shows a cross-sectional view of a configuration of a display device shown in FIG. 1 with respect to a line A-A of FIG. 1.

Referring to FIG. 1 to FIG. 3, the display panel 10 includes a lower substrate 100 and an upper substrate 300 facing each other. The display panel 10 can also include a display layer 200 formed on the lower substrate 100 and a touch electrode layer 400 for forming a touch sensor on the upper substrate 300. The lower substrate 100 and the upper substrate 300 can be sealed by a sealant 500 in the peripheral area (PA).

The lower substrate 100 can be formed of a transparent insulating material such as a glass substrate. The display layer 200 can include an electro-optical active layer. The display layer 200 can include a plurality of pixels and a plurality of display signal lines (not shown) electrically connected to the pixels. The display layer 200 can transmit a driving signal to the pixels. The display layer 200 is generally provided in the display area (DA).

The display signal lines can include a plurality of gate lines (not shown) for transmitting a gate signal and a plurality of data lines (not shown) for transmitting a data signal to the pixels. The gate lines can extend to cross the data lines. The display signal line can extend to the peripheral area (PA) to form a pad (not shown).

The pixels can be substantially arranged in a matrix form, but are not limited thereto. Each pixel can include a switching element (not shown) electrically connected to the gate line, the data line and a pixel electrode (not shown) electrically connected to the data line. The switching element can be a three-terminal element such as a thin film transistor (TFT) integrated with the display panel 10. The switching element is turned on or turned off according to the gate signal transmitted to selectively transmit the data signal. The pixel can further include the pixel electrode and a common electrode (not shown) facing it. In the case of the organic light-emitting diode (OLED) display, an emission layer can be provided between the pixel electrode and the common electrode, and can form a light-emitting device (LD). The common electrode can transmit the common voltage.

In order to implement color display, each pixel can display a primary color, and a desired color can be recognized by combining the primary colors. An example of the primary colors can include three primary colors such as red, green, blue, and the like. Each pixel can further include a color filter formed corresponding to each pixel electrode and expressing one of the primary colors. The emission layer included in the light-emitting element can emit colored light.

The touch electrode layer 400 can be formed of a transparent insulating material such as glass and can include a plurality of first and second touch electrodes 410 and 420. The touch electrode layer 400 is typically provided in the touch active area (TA).

The touch sensor formed by the touch electrode layer 400 can sense the contact in various ways. The touch sensor can be a resistive type, a capacitive type, an electro-magnetic type or an optical type. The capacitive touch sensor will be exemplified in the present exemplary embodiment.

The sealant 500 is provided in the peripheral area (PA). The sealant 500 can substantially surround the display area (DA) and can form a closed curve. The sealant 500 can be interposed between the lower substrate 100 and the upper substrate 300, and can prevent permeation of an impurity such as moisture or oxygen into a space between the lower substrate 100 and the upper substrate 300. A reflection layer (not shown) can be provided to the space between the lower substrate 100 and the sealant 500 for the purpose of increasing the efficiency of using laser beams that are irradiated when the sealant 500 is formed. A plane area occupied by the reflection layer can be substantially equal to a plane area occupied by the sealant 500.

For example, a sealing material can be coated on the lower substrate 100 or the insulating layer stacked on the lower substrate 100 according to a printing method such as a screen printing. The upper substrate 300 is then provided. Laser beams are irradiated on a part of which the sealing material is coated, thereby forming the sealant 500. The coated sealing material can be a frit in a solid state. When laser beams are irradiated to a sealing material, the sealing material is melted and attached like an adhesive to the lower substrate 100 and the upper substrate 300. The sealing material is hardened while attached to the lower substrate 100 and the upper substrate 300, forming the sealant 500 that combines the lower substrate 100 and the upper substrate 300. Therefore, in order to form the sealant 500 that combines and seals the lower substrate 100 and the upper substrate 300, the laser beams must be irradiated to the printed sealing material while the upper substrate 300 is provided over the lower substrate 100. Typically, the touch electrode layer 400 and touch signal lines 411, 412, and 421 are formed on the upper substrate 300, and the upper substrate 300 is then combined to the lower substrate 100. Therefore, when a non-transparency touch signal line is formed on a part that overlaps the sealant 500, irradiation of laser beams to the sealing material can be prevented.

In addition, for example, when the laser beams are irradiated, the sealing material in a gel state can be hardened to form the sealant 500 according to a characteristic of the sealing material.

In the case of an organic light-emitting diode (OLED) display, the upper substrate 300 can function as a sealing substrate. That is, the upper substrate 300 can seal the light-emitting device (LD) to be described and can prevent penetration of moisture and/or oxygen from the outside.

The touch signal lines 411, 412, and 421 can be formed of a metal material for transmitting/receiving a signal to/from the first and second touch electrodes 410 and 420 of the touch electrode layer 400. The touch signal lines 411, 412, and 421 can be provided in the peripheral area (PA). A second signal line 421b of the touch signal lines can be provided to substantially overlap the sealant 500. In this case, the second signal line 421b has a limit of line width, for example, less than 5 μm. On the contrary, a signal line 421a can have a wider range of line width, for example, between a range from about 4.5 μm to about 195 μm. When the laser beams are irradiated from an upper side of the second signal line 421b, part of the laser beams is screened by the width of the second signal line 421b. When the width of the second signal line 421b is narrow, for example, less than 5 μm, the laser beams can reach a lower side of the second signal line 421b because of diffraction. Thus, energy for melting the sealing material can be applied to the sealing material.

An anti-reflection layer 610 for reducing reflection of external light can be formed over the touch electrode layer 400. The anti-reflection layer 610 can be a polarization layer including a linear polarizer and a retarder.

A window 700, exemplarily formed of glass, can be formed over the anti-reflection layer 610 in order to substantially protect the lower substrate 100, the display layer 200, the upper substrate 300, and the touch electrode layer 400. A light blocking layer 710 can be formed on a side that faces the upper substrate 300 on an edge of the window 700. The light blocking layer 710 can be formed to substantially cover at least a part of the peripheral area (PA). The window 700 can be attached to the anti-reflection layer 610 through an adhesive layer 620 formed of an adhesive material such as a resin.

Figure 4:
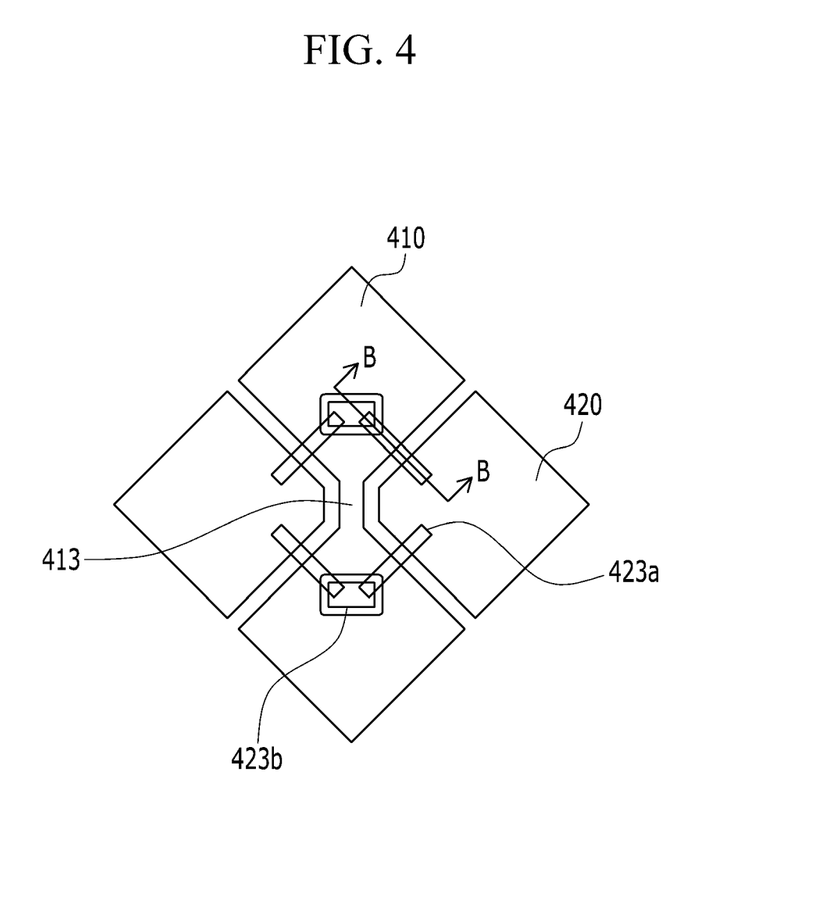
FIG. 4 shows a partial enlarged view of a touch sensor shown in FIG. 3.
Figure 5:
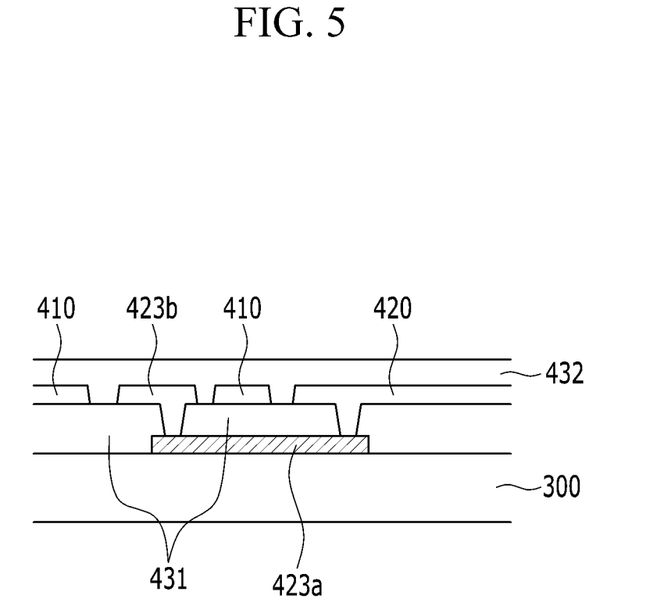
FIG. 5 shows a cross-sectional view of a touch sensor shown in FIG. 4 with respect to a line B-B.

Referring to FIG. 3 to FIG. 5, the touch electrode layer 400 according to an exemplary embodiment will now be described in detail.

FIG. 3 shows a top plan view of a touch sensor of a display device according to an exemplary embodiment. FIG. 4 shows a partial enlarged view of the touch sensor shown in FIG. 3. FIG. 5 shows a cross-sectional view of the touch sensor shown in FIG. 4 with respect to a line B-B.

Referring to FIG. 3, the touch electrode layer 400 is formed on the upper substrate 300. The touch electrode layer 400 is formed in the touch active area (TA) in which touching can be sensed. The touch active area (TA) can be an entire region of the display area (DA) and it can include part of the peripheral area (PA). A part of the display area (DA) can also be the touch active area (TA).

The touch electrode layer 400 includes a plurality of touch electrodes which include a plurality of the first touch electrodes 410 and a plurality of the second touch electrodes 420. The first touch electrodes 410 are physically and electrically separated from the second touch electrodes 420.

The first touch electrodes 410 and the second touch electrodes 420 can be alternately formed so that they do not substantially overlap each other in the touch active area (TA). The first and second touch electrodes 410 and 420 can be formed in a column direction and a row direction.

In the exemplary embodiments, the first touch electrodes 410 and the second touch electrodes 420 are formed on the same layer, but they can also be formed on different layers. In the exemplary embodiments, the first and second touch electrodes 410 and 420 are substantially quadrangular, but they can have various shapes. For example, the first and second touch electrodes 410 and 420 can have protrusions so as to improve sensitivity of the touch electrode layer 400.

The first touch electrodes 410 formed in the same column or row can be electrically connected with or separated from one another inside or outside the touch active area (TA). In a like manner, at least a portion of the second touch electrodes 420 formed on the same column or row can be electrically connected with or separated from one another inside or outside the touch active area (TA). For example, as shown in FIG. 3, when the first touch electrodes 410 formed in the same column are electrically connected to one another inside the touch active area (TA), the second touch electrodes 420 formed in the same row can be electrically connected to one another inside the touch active area (TA). That is, the first touch electrodes 410 formed in the respective columns can be electrically connected to one another through a first connector 413, and the second touch electrodes 420 formed in the respective rows can be electrically connected to one another through second connectors.

Referring to FIG. 4 and FIG. 5, the first connector 413 can be formed on the same layer as the first touch electrode 410, and can be formed of the same material as the first touch electrode 410. That is, the first touch electrode 410 and the first connector 413 can be formed integrally and can be patterned substantially simultaneously.

The second connectors can include a lower connector 423a and an upper connector 423b that are formed on different layers. The lower connector 423a at least partially overlaps the first touch electrode 410 and the second touch electrode 420. The first touch electrode 410 can be insulated by a first insulating layer 431. The upper connector 423b can be formed like an island inside the first touch electrode 410 and can be separated from the first touch electrode 410. The upper connector 423b can be formed of the same material as the second touch electrode 420, and they can be patterned substantially simultaneously. The lower connector 423a can be formed of the same material as touch signal lines 411, 412, and 421, and they can be patterned substantially simultaneously.

Two of the lower connectors 423a can make a group with the upper connector 423b so as to electrically connect the neighboring first touch electrodes 410. First ends of the lower connectors 423a are electrically connected to the second touch electrodes 420 neighboring each other, and second ends of the lower connector 423a are electrically connected to the upper connector 423b. That is, one of the second touch electrodes 420 neighboring each other is electrically connected to the first end of the lower connector 423a through a contact hole with the first insulating layer 431 therebetween. The upper connector 423b is electrically connected to the second end of the lower connector 423a through the contact hole with the first insulating layer 431 therebetween. In a like manner, another one of the second touch electrodes 420 neighboring each other is electrically connected to the first end of another lower connector 423a through a contact hole with the first insulating layer 431 therebetween. The upper connector 423b is electrically connected to the second end of the other lower connector 423a through a contact hole with the first insulating layer 431 therebetween. Accordingly, the one second touch electrode 420 is electrically connected to the other second touch electrode 420 through the one lower connector 423a, the upper connector 423b, and the other lower connector 423a. The above-noted connection can be performed in two places as shown in FIG. 4, thereby reducing resistance caused by the connector.

Referring to FIG. 5, the lower connector 423a is formed on the upper substrate 300, and the first insulating layer 431 is formed thereon. The first and second touch electrodes 410 and 420 and the upper connector 423b are formed on the first insulating layer 431. The first and second touch electrodes 410 and 420 and the upper connector 423b can be formed of the same material and can be patterned substantially simultaneously. The second touch electrode 420 and the upper connector 423b are electrically connected to the lower connector 423a through the contact hole. A second insulating layer 432 can be formed on the first touch electrode 410, the second touch electrode 420, and the upper connector 423b so as to protect the same. The first and second insulating layers 431 and 432 can be formed of SiOx, SiNx, and/or SiOxNy.

Referring to FIG. 3, the first touch electrodes 410 are electrically connected to the touch controller 30 through the first touch signal lines 411 and 412. The second touch electrodes 420 are electrically connected to the touch controller 30 through the second touch signal line 421. The first touch signal lines 411 and 412 can have a double routing structure including signal lines electrically connected to an upper portion of the first touch electrodes 410 on the same column and a signal lines electrically connected to a lower portion thereof. The first touch signal lines 411 and 412 and the second touch signal line 421 are, as shown in FIG. 3, formed in the peripheral area (PA). Ends of the first touch signal lines 411 and 412 and the second touch signal line 421 form a pad 450 in the peripheral area (PA).

The first and second touch electrodes 410 and 420 can have predetermined transmittance so that light can transmit through the display layer 200. For example, the first and second touch electrodes 410 and 420 can be formed of a thin metal (such as indium tin oxide (ITO), indium zinc oxide (IZO), or a silver nanowire (AgNw)), a metal mesh, or a transparent conductive material (such as carbon nanotubes (CNT)). The first connector 413 and the upper connector 423b can be formed the same material.

The first and second touch signal lines 411, 412 and 421 and the lower connector 423a can be formed of a metal material such as molybdenum (Mo), silver (Ag), titanium (Ti), copper (Cu), aluminum (Al), or molybdenum/aluminum/molybdenum (Mo/Al/Mo). According to some embodiments, The first and second touch signal lines 411, 412 and 421, and the lower connector 423a can be formed of the same transparent conductive material as the first and second touch electrodes 410 and 420.

The first and second touch electrodes 410 and 420 neighboring each other can form a mutual sensing capacitor functioning as a touch sensing sensor. The mutual sensing capacitor can include a sensing input electrode for receiving a sensing input signal through one of the first and second touch electrodes 410 and 420. The mutual sensing capacitor can also include a sensing output for outputting a change of an amount of charges caused by contact of an external object as a sensing output signal. In the present specification, the sensing input signal and the sensing output signal will be referred to as a touch signal together.

Differing from FIG. 3 to FIG. 5, a plurality of first touch electrodes 410 can be separated from one another and a plurality of second touch electrodes 420 can also be separated from one another, and they can be electrically connected to the touch controller 30 through an independent touch signal line (not shown). In this case, the respective touch electrodes can form a self-sensing capacitor with the touch sensing sensor. The self-sensing capacitor can receive a sensing input signal and be stored with a predetermined amount of charge. When an external object such as a finger contacts it, it can output a sensing output signal that is different from the sensing input signal that is input when the stored amount of charge is changed.

Figure 6:
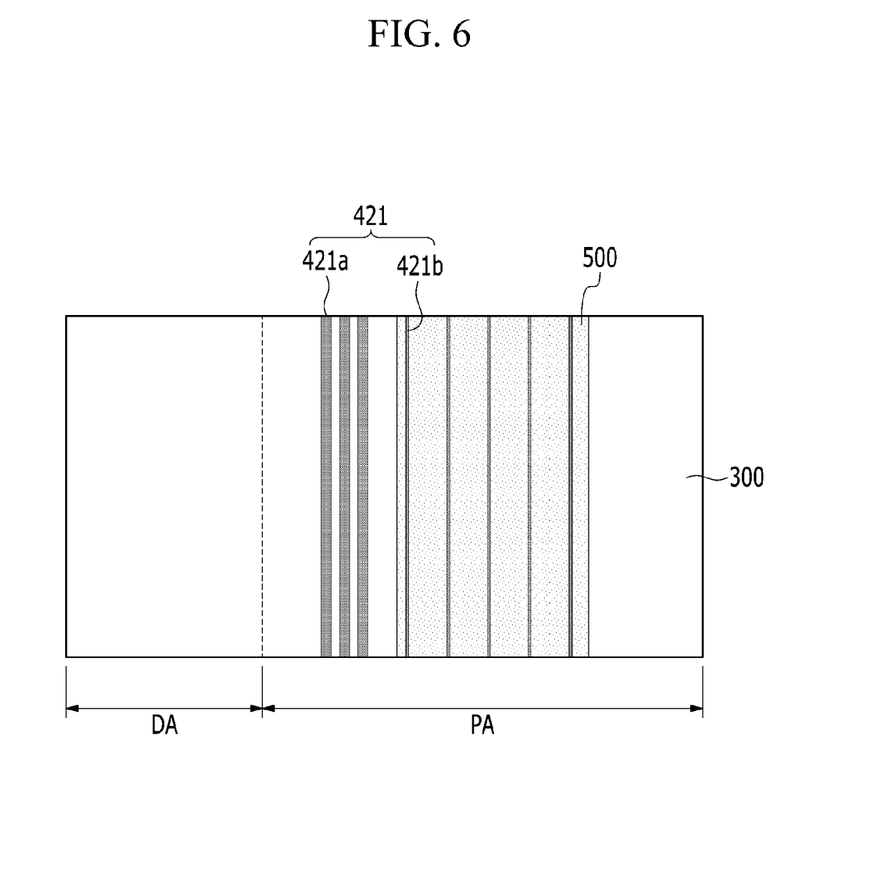
FIG. 6 shows a touch signal line according to an exemplary embodiment.
Figure 7:
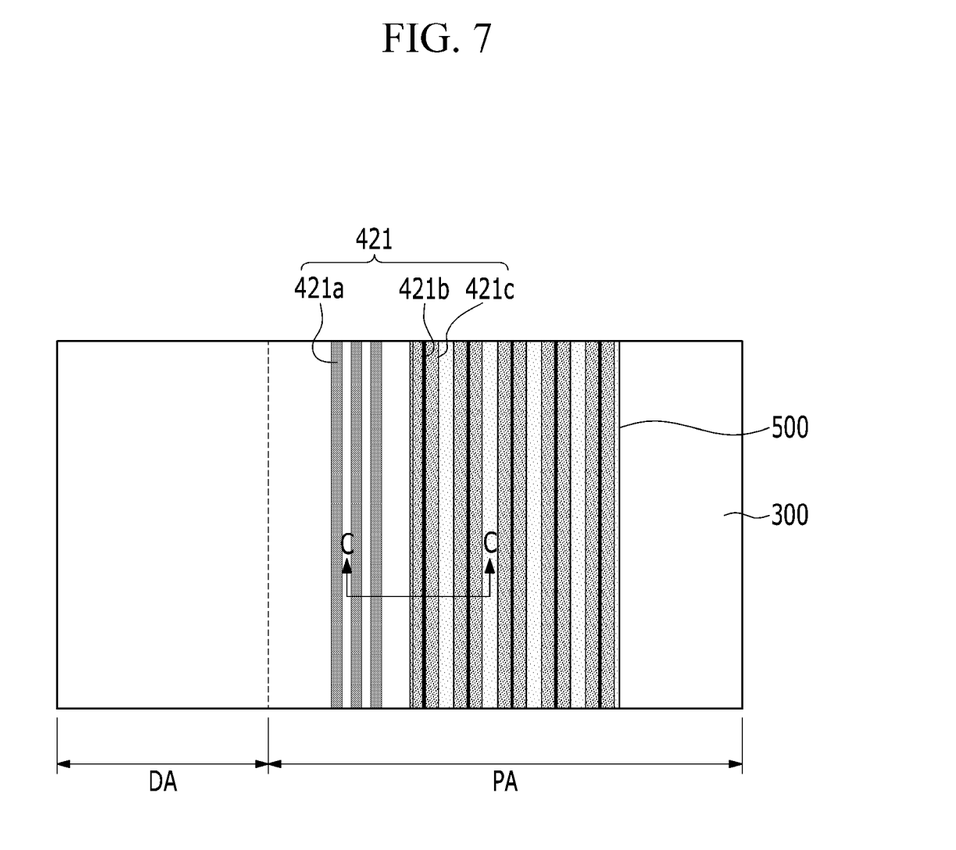
FIG. 7 shows a touch signal line according to another exemplary embodiment.
Figure 8:
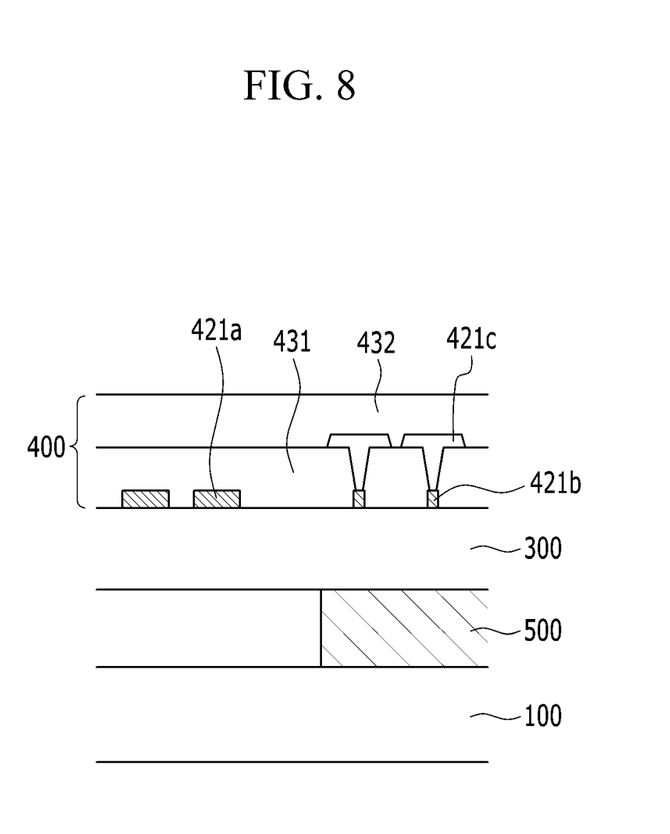
FIG. 8 shows an exemplary cross-sectional view with respect to a line C-C of FIG. 7.

Referring to FIG. 6 to FIG. 8, a touch signal line according to an exemplary embodiment will now be described.

FIG. 6 shows a touch signal line according to an exemplary embodiment. FIG. 7 shows a touch signal line according to another exemplary embodiment. FIG. 8 shows an exemplary cross-sectional view with respect to a line C-C of FIG. 7.

FIG. 6 to FIG. 8 show an example of a ground plan of the second touch signal line 421 formed on the upper substrate 300 in the peripheral area (PA). When the second touch signal line 421 is formed in the right peripheral area (PA) of the display panel as exemplarily described, the formation of the touch signal line 421 can be understood to be applicable to the left, top, and bottom peripheral areas (PA). Therefore, the second touch signal line 421 will be called a touch signal line 421 hereinafter. Further, the number of illustrated touch signal lines is exemplary, and the total number of touch signal lines varies with the position in the peripheral area (PA)

Another constituent element of the display panel can also be formed in the peripheral area (PA), but the touch signal line 421 and the sealant 500 are shown in order to clarify their positional relationship.

Referring to FIG. 6, the touch signal line 421 includes a signal line 421a of a first group and a signal line 421b of a second group. The signal lines 421a and 421b are formed in the peripheral area (PA), but the signal line 421b is formed to substantially overlap the sealant 500. The signal line 421a is formed between the display area (DA) and the sealant 500. The signal lines 421a and 421b are formed over the upper substrate 300, and the sealant 500 is formed below the upper substrate 300 (refer to FIG. 2 and FIG. 8). The first and second groups can include a plurality of signal lines and can also include a single signal line.

As an example, the signal line 421b formed near the display area (DA) can be formed away from the display area (DA) by more than about 200 μm so as to prevent the display area (DA) from being blocked from view. Also, as an example, the signal line 421a can be formed away from the sealant 500 by more than about 100 μm for the purpose of irradiation of laser beams. The width of the signal line 421a can be about 4.5 μm to about 195 μm, and the width can vary depending on the position of the signal line 421a. The thicker the signal line, the less resistance, but this limits the number of and the area in which the signal lines 421a can be formed. When the plurality of signal lines 421a are formed, a gap between the neighboring signal lines can be about 4 μm to about 5 μm.

The signal line 421b has a relatively limited range of width compared to the signal line 421a that can have a wide range of width. The signal line 421b has a width such that the laser beams can be irradiated below the signal line 421b according to the diffraction phenomenon when the laser beams are irradiated and the signal line 421b hides the sealant 500. For example, the width can be about 6 μm which can be incremented or decremented according to a wavelength of the laser beams. Because more diffraction occurs as the width lessens, the signal line 421b can have a width that is less than about 5 μm in consideration of the wavelength of laser beams. The upper limit of the width can be about 6 μm depending on the exemplary embodiment. When the plurality of signal lines 421b are formed, the gap between the neighboring signal lines is not limited and exemplarily can be about 100 μm.

FIG. 7 and FIG. 8 are substantially similar to the exemplary embodiment of FIG. 6. FIGS. 7 and 8 show an embodiment in which an auxiliary line 421c is formed of a transparent conductive material on the signal line 421b and contacts the signal line 421b. As described above, in some embodiments, the signal line 421b has a restriction on the line width. When the resistance is high, transmission and receiving of the touch signal is worsened and sensing of the touch sensor can deteriorate. In this case, resistance of the corresponding signal line can be reduced by forming a contact hole in the first insulating layer 431 formed on the signal line 421b and by forming an auxiliary line 421c that is a conductor contacting the signal line 421b.

The auxiliary line 421c can be extended throughout the entire length of the signal line 421b and can contact it. The auxiliary line 421c transmits light so as to form the sealant 500 by irradiation of laser beams. The auxiliary line 421c can be relatively wide so that a short circuit can be prevented.

The auxiliary line 421c can be formed of a transparent conductive material such as ITO, IZO, ZnO, or $In_2O_3$. The auxiliary line 421c can be formed without an additional process or an additional mask. For example, the mask used to form the first and second touch electrodes 410 and 420 can be used to form the auxiliary electrode 421c so that they can be substantially simultaneously formed of the same material. Therefore, in an exemplary embodiment, the auxiliary line 421c and the signal lines 421a and 421b can be formed by changing the pattern of the conventionally used mask.

Figure 9:
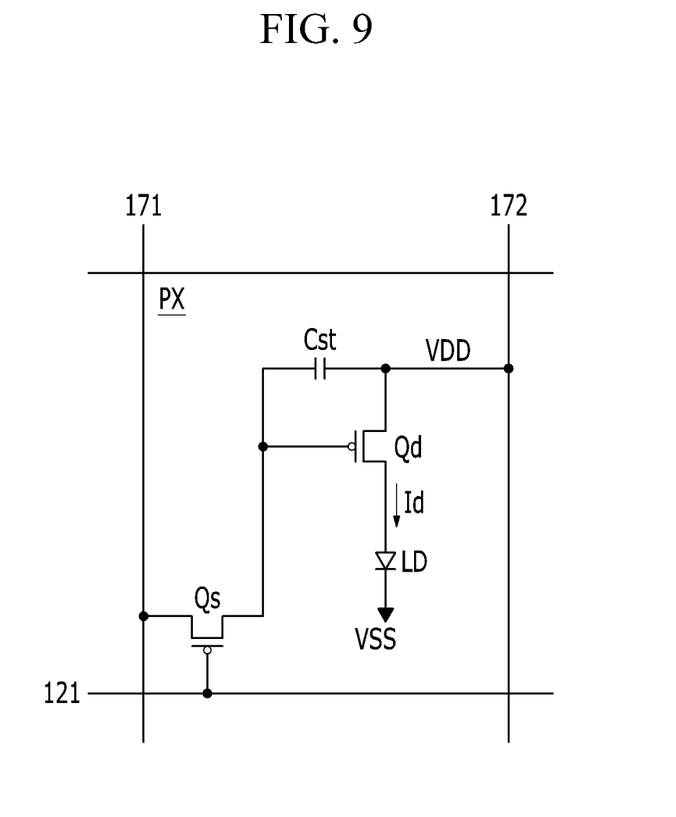
FIG. 9 shows an equivalent circuit diagram of a pixel of a display device according to an exemplary embodiment.
Figure 10:
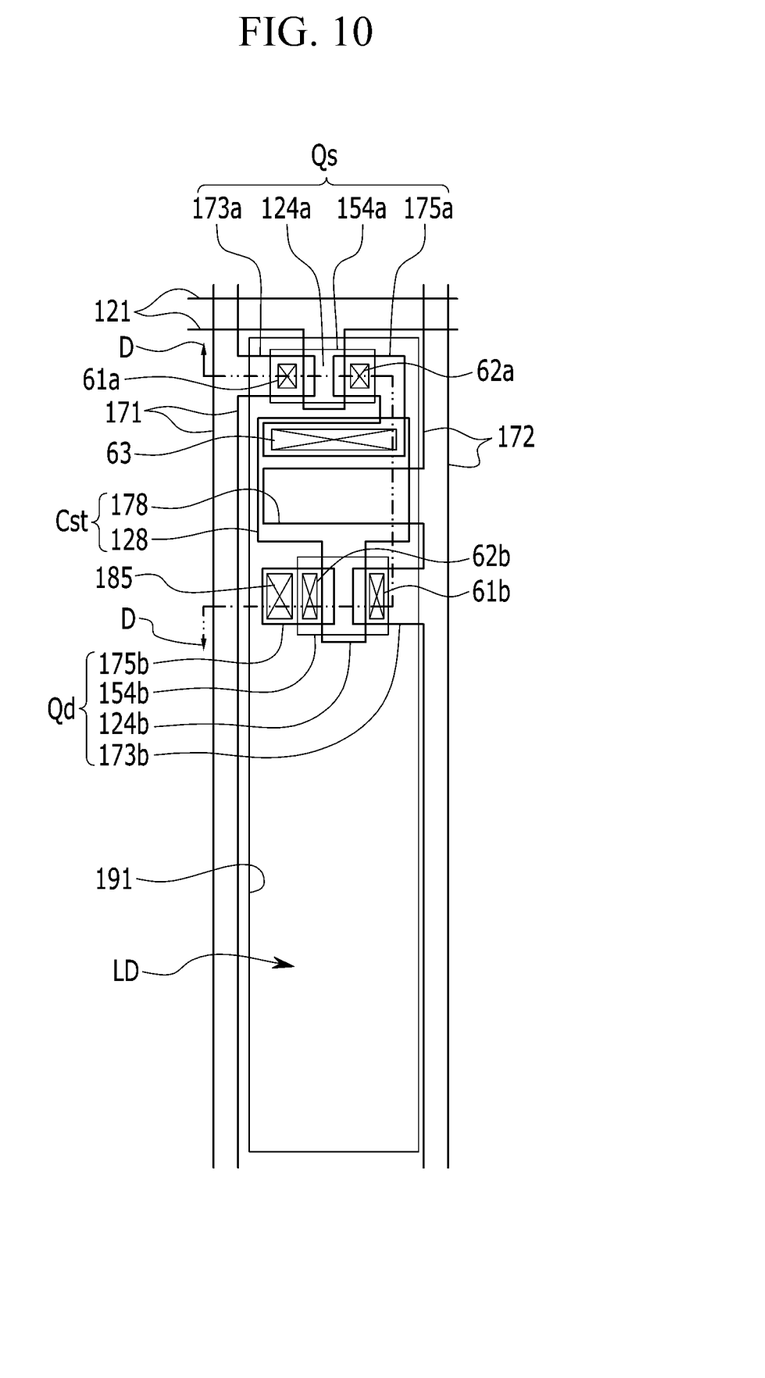
FIG. 10 shows a layout view of a pixel of a display device according to an exemplary embodiment.
Figure 11:
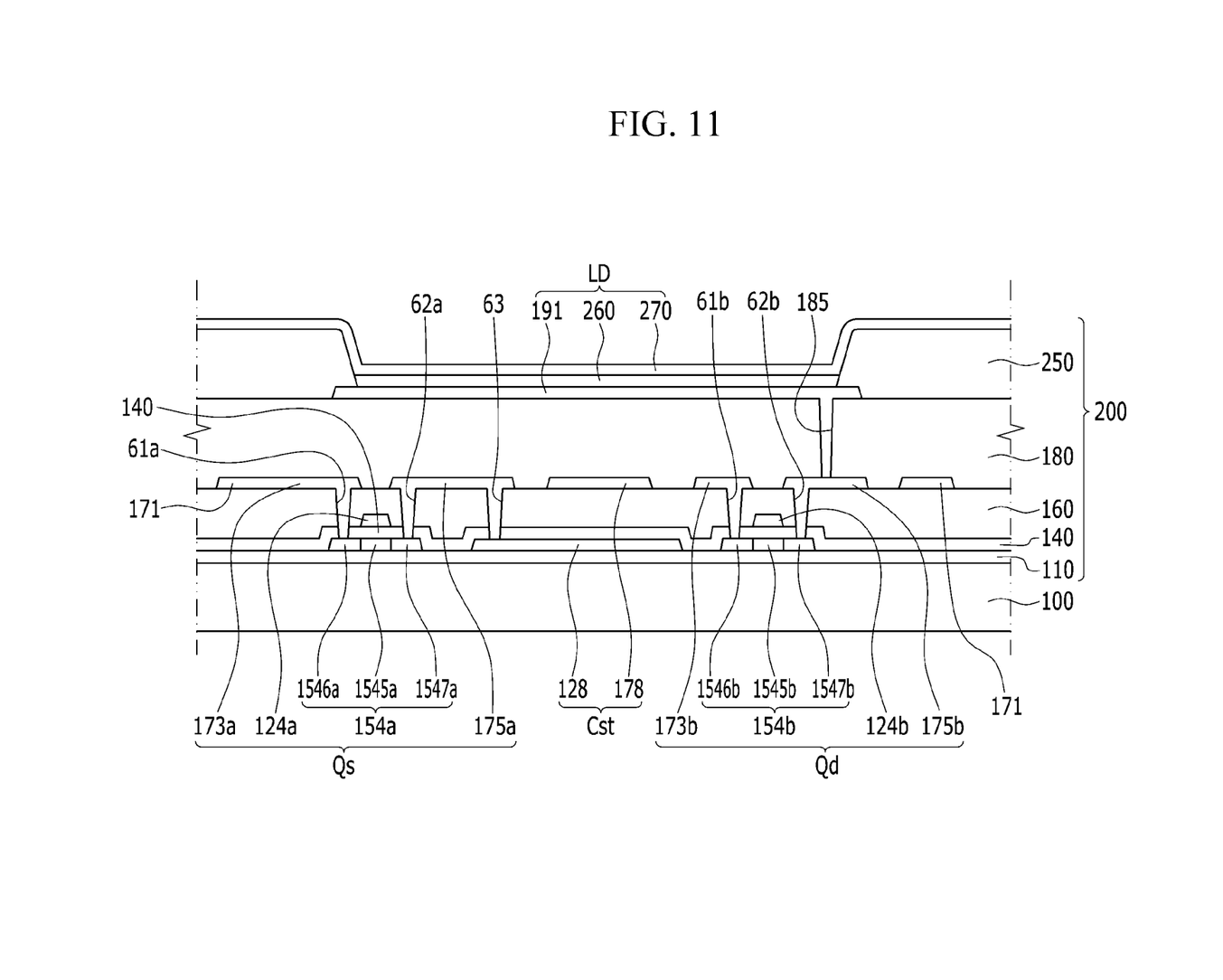
FIG. 11 shows a cross-sectional view with respect to a line D-D of FIG. 10.

Referring to FIGS. 9 to 11, a pixel of the OLED display according to an exemplary embodiment will now be described.

FIG. 9 shows a circuit diagram of a pixel of a display device according to an exemplary embodiment. FIG. 10 shows a layout view of the pixel. FIG. 11 shows a cross-sectional view with respect to a line D-D of FIG. 10.

As described above, the display layer 200 includes a plurality of switching and driving TFTs (Qs and Qd), a plurality of storage capacitors (Cst), and a plurality of the light-emitting devices (LD). That is, the display layer 200 includes a plurality of pixels.

Referring to FIG. 9, the display device includes the signal lines 121, 171, and 172 and a plurality of pixels (PX) connected thereto and arranged in a matrix form.

The signal lines include a plurality of gate lines 121 for transmitting the gate signal, a plurality of data lines 171 for transmitting the data signal, and a plurality of driving voltage lines 172 for transmitting a driving voltage (VDD). The gate lines 121 extend in a row direction and are substantially parallel to one another. The data lines 171 and the driving voltage lines 172 extend in a column direction and are substantially parallel to one another. The gate signals and the data signals can be received through the display controller 20.

The pixels (PX) include the switching thin film transistor (Qs), the driving thin film transistor (Qd), a storage capacitor (Cst), and the light-emitting device (LD).

The switching thin film transistor (Qs) includes a control terminal, an input terminal, and an output terminal. The control terminal is electrically connected to the gate line 121, the input terminal is electrically connected to the data line 171, and the output terminal is electrically connected to the driving thin film transistor (Qd). The switching thin film transistor (Qs) can transmit the data signal to the driving thin film transistor (Qd) in response to the gate signal.

The driving thin film transistor (Qd) also includes a control terminal, an input terminal, and an output terminal. The control terminal is electrically connected to the switching thin film transistor (Qs). The input terminal is electrically connected to the driving voltage line 172. The output terminal is electrically connected to the light-emitting device (LD). The driving thin film transistor (Qd) can output an output current (Id) corresponding to a voltage between the control terminal and the output terminal.

The storage capacitor (Cst) is electrically connected to the control terminal and the input terminal of the driving thin film transistor (Qd). The storage capacitor (Cst) charges the data signal applied to the control terminal and maintains it when the switching thin film transistor (Qs) is turned off.

The light-emitting device (LD) that can be an OLED that includes an anode connected to the output terminal of the driving TFT (Qd) and a cathode electrically connected to a common voltage (VSS). The light-emitting device (LD) can display an image by varying intensity according to the output current (Id) of the driving thin film transistor (Qd).

The switching thin film transistor (Qs) and the driving TFT (Qd) can be n-channel electric field effect transistors (FET) or p-channel electric FET. The electrical connections to the switching and driving TFTs (Qs and Qd), the storage capacitor (Cst), and the light-emitting device (LD) can be varied.

Referring to FIG. 10 and FIG. 11, the display device includes the lower substrate 100, the display layer 200 formed on the lower substrate 100, and the light-emitting device (LD).

The lower substrate 100 can be formed of transparent glass or plastic. The lower substrate 100 can be flexible.

The display layer 200 can include a buffer layer 110, switching and driving semiconductor layers 154a and 154b, a gate insulating layer 140, the gate line 121, a first capacitive plate 128, an inter-layer insulating layer 160, the data line 171, the driving voltage line 172, a switching drain electrode 175a, a driving drain electrode 175b, and a passivation layer 180.

The buffer layer 110 is formed on the lower substrate 100 and can be formed of silicon nitride (SiNx), silicon oxide (SiOx), and silicon oxynitride (SiOxNy). The buffer layer 110 can be formed of a single layer or multiple layers. The buffer layer 110 can prevent permeation of impurities, moisture, or air that degrades the performance of the semiconductor, and the buffer layer 110 can also flatten a surface.

The switching semiconductor layer 154a and the driving semiconductor layer 154b are separately formed on the buffer layer 110. The switching semiconductor layer 154a and the driving semiconductor layer 154b are formed of polysilicon, and include channel regions (1545a) and (1545b), source regions (1546a) and (1546b), and drain regions (1547a) and (1547b). The source regions (1546a) and (1546b) and the drain regions (1547a) and (1547b) are formed on respective sides of the channel regions (1545a) and (1545b).

In some embodiments, the channel regions (1545a) and (1545b) are formed of polysilicon that does not have impurity doped, that is, intrinsic semiconductors. The source regions (1546a) and (1546b) and the drain regions (1547a) and (1547b) are conductive impurity doped polysilicon, that is, impurity semiconductors.

The gate insulating layer 140 is formed on the channel regions (1545a) and (1545b) of the switching semiconductor layer 154a and the driving semiconductor layer 154b. The gate insulating layer 140 can be formed of a single layer or multiple layers formed of silicon nitride and/or silicon oxide.

The gate line 121 is formed on the gate insulating layer 140, and the first capacitive plate 128 is formed on the buffer layer 110.

The gate line 121 extends in the horizontal direction and transmit the gate signal. The gate line 121 includes a switching gate electrode 124a protruding into the switching semiconductor layer 154a. The first capacitive plate 128 includes a driving gate electrode 124b protruding into the driving semiconductor layer 154b. The switching gate electrode 124a and the driving gate electrode 124b substantially overlap the channel regions (1545a) and (1545b) respectively.

An inter-layer insulating layer 160 is formed on the gate line 121, the first capacitive plate 128, and the buffer layer 110

A switching source contact hole 61a and a switching drain contact hole 62a for respectively exposing a source region 1546a and a drain region 1547a of the switching semiconductor layer 154a are formed in the inter-layer insulating layer 160. Further, a driving source contact hole 61b and a driving drain contact hole 62b for respectively exposing a source region 1546b and a drain region 1547b of the driving semiconductor layer 154b are formed in the inter-layer insulating layer 160.

The data line 171, the driving voltage line 172, the switching drain electrode 175a, and the driving drain electrode 175b are formed on the inter-layer insulating layer 160.

The data line 171 can transmit the data signal and can cross the gate line 121. The data line 171 includes a switching source electrode 173a extending from the data line 171 toward the switching semiconductor layer 154a.

The driving voltage line 172 can transmit the driving voltage and can be separated from the data line 171. The driving voltage line 172 extends in substantially the same direction as the data line 171. The driving voltage line 172 includes a driving source electrode 173b extending from the driving voltage line 172 toward the driving semiconductor layer 154b. The driving voltage line 172 includes a second capacitive plate 178 extending from the driving voltage line 172 and substantially overlapping the first capacitive plate 128. The first and second capacitive plates 128 and 178 form the storage capacitor (Cst) with the inter-layer insulating layer 160 as the dielectric material.

The switching drain electrode 175a faces the switching source electrode 173a and the driving drain electrode 175b faces the driving source electrode 173b.

The switching source electrode 173a and the switching drain electrode 175a are electrically connected to the source and drain regions 1546a and 1547a through the switching source contact hole 61a and the switching drain contact hole 62a, respectively. Further, the switching drain electrode 175a is electrically connected to the first capacitive plate 128 and the driving gate electrode 124b through a first contact hole 63 extended and formed in the inter-layer insulating layer 160.

The driving source electrode 173b and the driving drain electrode 175b are connected to the source region 1546b and the drain region 1547b of the driving semiconductor layer 154b through the driving source contact hole 61b and the driving drain contact hole 62b, respectively.

The switching semiconductor layer 154a, the switching gate electrode 124a, the switching source electrode 173a, and the switching drain electrode 175a form the switching thin film transistor (Qs). The driving semiconductor layer 154b, the driving gate electrode 124b, the driving source electrode 173b, and the driving drain electrode 175b form the driving thin film transistor (Qd).

The passivation layer 180 is formed on the data line 171, the driving voltage line 172, the switching drain electrode 175a, and the driving drain electrode 175b. A second contact hole 185 for exposing the driving drain electrode 175b is formed in the passivation layer 180.

The light-emitting device (LD) and a pixel defining layer 250 are formed on the passivation layer 180.

The light-emitting device (LD) includes a pixel electrode 191, an organic emission layer 260, and a common electrode 270.

The pixel electrode 191 is formed on the passivation layer 180, and it is electrically connected to the driving drain electrode 175b through the second contact hole 185. The pixel electrode 191 can be an anode of the light-emitting device (LD).

The pixel electrode 191 can be formed of a transparent conductive material such as ITO, IZO, ZnO, or $In_2O_3$, or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The pixel defining layer 250 is formed on an edge of the pixel electrode 191 and the passivation layer 180. The pixel defining layer 250 includes an opening for exposing the pixel electrode 191. The pixel defining layer 250 can be made of a resin such as a polyacrylate or a polyimide.

The organic emission layer 260 is formed on the pixel electrode 191 in the opening of the pixel defining layer 250. The organic emission layer 260 includes an emission layer and it can be formed of multiple layers including at least one of a hole injection layer (HIL), a hole transporting layer (HTL), an electron transporting layer (ETL), and an electron injection layer (EIL). When the organic emission layer 260 includes all the layers, the hole injection layer can be formed on the pixel electrode 191. The hole transporting layer, the emission layer, the electron transporting layer, and the electron injection layer can be sequentially stacked thereon.

The organic emission layer 260 can include a red organic emission layer for emitting red light, a green organic emission layer for emitting green light, and a blue organic emission layer for emitting blue light. The red, green, and blue organic emission layers are formed on the red pixel, the green pixel, and the blue pixel, respectively, and can display a color image. The organic emission layer 260 can have the red, green, and blue organic emission layers stacked on the red pixel, the green pixel, and the blue pixel so as to form red, green and blue filters for each pixel.

The common electrode 270 is formed on the pixel defining layer 250 and the organic emission layer 260. The common electrode 270 can be formed of a metal such as lithium, calcium, lithium fluoride/calcium, lithium fluoride/aluminum, aluminum, silver, magnesium, or gold, or a transparent conductive material such as ITO, IZO, ZnO, or $In_2O_3$. The common electrode 270 can be a cathode of the light-emitting device (LD).

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a lower substrate and an upper substrate;
   a sealant interposed between the lower substrate and the upper substrate;
   a display layer formed on the lower substrate, wherein the display layer includes an electro-optical active layer;
   a touch electrode layer formed on the upper substrate, wherein the touch electrode layer includes a plurality of touch electrodes; and
   a display panel including a plurality of touch signal lines configured to transmit/receive touch signals to/from the touch electrodes,
   wherein the display panel includes a display area and a non-display area in a peripheral area of the display device,
   wherein the sealant is formed in the peripheral area, and
   wherein, in the peripheral area, the touch signal lines include one or more first signal lines not overlapping the sealant and one or more second signal lines at least partially overlapping the sealant, and
   wherein the second signal lines are thinner than the first signal lines.

2. The display device of claim 1, wherein the touch signal lines are formed on the same layer as the touch electrodes.

3. The display device of claim 2, wherein the second signal lines each has a width less than about 5 µm.

4. The display device of claim 3, wherein a gap is formed between neighboring ones of the second signal lines, wherein the width of the gap is greater than about 100 µm.

5. The display device of claim 4, wherein each of the second signal lines is formed of a metal.

6. The display device of claim 5, wherein the touch signal lines further include one or more auxiliary lines contacting the second signal lines.

7. The display device of claim 6, wherein each of the auxiliary lines is formed of a transparent conductive material.

8. The display device of claim 7, wherein the auxiliary lines and the second signal lines have substantially the same length.

9. The display device of claim 1, wherein each of the first signal lines is formed of a metal.

10. The display device of claim 9, wherein the first signal lines each has a width of about 4.5 µm to about 195 µm.

11. The display device of claim 10, wherein a gap is formed between neighboring ones of the first signal lines, wherein the width of the gap is about 4 µm to about 5 µm.

12. The display device of claim 1, further including a reflection layer formed between the sealant and the lower substrate.

13. The display device of claim 1, wherein the touch electrodes include at least one pair of a first touch electrode and a second touch electrode, and wherein one of the first touch and second touch electrodes is a sensing input electrode and the other touch electrode is a sensing output electrode.

14. The display device of claim 13, wherein the touch signal lines further include a plurality of first touch signal lines respectively electrically connected to the first touch electrodes and a plurality of second touch signal lines respectively electrically connected to the second touch electrodes.

15. The display device of claim 1, wherein the electro-optical active layer is an organic emission layer and wherein the upper substrate is an encapsulation substrate.

16. A display device, comprising:
   first and second substrates including a display area and a non-display area;
   a sealant interposed between the first and second substrates and formed in the non-display area;
   a plurality of touch electrodes formed in the display area of the second substrate; and
   a plurality of touch signal lines formed in the non-display area of the second substrate and respectively electrically connected to the touch electrodes,
   wherein the touch signal lines are configured to transmit/receive touch signals to/from the touch electrodes, wherein the touch signal lines include one or more first signal lines not overlapping the sealant and one or more second signal lines at least partially overlapping the sealant, and wherein the second signal lines are thinner than the first signal lines.

17. The display device of claim 16, wherein the second signal lines each has a width less than about 5 µm.

18. A display device, comprising:

first and second substrates including a display area and a non-display area;

a sealant interposed between the first and second substrates and formed in the non-display area;

a plurality of touch electrodes formed in the display area of the second substrate; and a plurality of touch signal lines formed in the non-display area of the second substrate and respectively electrically connected to the touch electrodes, wherein the touch signal lines are configured to transmit/receive touch signals to/from the touch electrodes, wherein the touch signal lines comprise at least one first touch signal line that overlaps the sealant and at least one second touch signal line that does not overlap the sealant, and wherein the first touch signal line is thinner than the second touch signal line.

* * * * *